United States Patent [19]
Wen

[11] Patent Number: 5,869,863
[45] Date of Patent: Feb. 9, 1999

[54] MEMORY HAVING A TRENCH TYPE GATE STRUCTURE

[75] Inventor: Jemmy Wen, Hsinchu, Taiwan

[73] Assignee: United Microelectronics Corp., Hsinchu, Taiwan

[21] Appl. No.: 15,950

[22] Filed: Jan. 30, 1998

Related U.S. Application Data

[62] Division of Ser. No. 839,633, Apr. 15, 1997.

[30] Foreign Application Priority Data

Feb. 25, 1997 [TW] Taiwan .................................. 86102295

[51] Int. Cl.$^6$ ...................................................... H01L 29/76
[52] U.S. Cl. ............................ 257/330; 257/334; 257/390
[58] Field of Search .................................... 257/330, 334, 257/390; 438/270, 272, 278, 300

[56] References Cited

U.S. PATENT DOCUMENTS 4,818,717  4/1989  Johnson et al. .

5,602,049  2/1997  Wen et al. .
5,668,031  9/1997  Hsue et al. .

*Primary Examiner*—Jerome Jackspn
*Assistant Examiner*—George C. Eckert II
*Attorney, Agent, or Firm*—Finnegan, Henderson, Farabow, Garrett & Dunner, L.L.P.

[57] ABSTRACT

A read-only memory (ROM) and method for manufacturing a ROM having trench-type gate regions and source/drain regions, wherein the trench-type gate regions are provided in a substrate. The ROM further includes an insulating layer for isolating the substrate from the source/drain regions so to prevent current leakage between the source/drain regions and the substrate and to reduce area required by components of the ROM, thereby increasing component integration. The ROM also comprises a checkerboard conductive layer having a plurality of parallel source/drain regions a plurality of parallel channel regions connected to the plurality of parallel source/drain regions, wherein the plurality of parallel source/drain regions and the plurality of parallel channel regions cross each other at right angle, while the source/drain regions and the trench-type gate regions are approximately parallel to each other.

14 Claims, 9 Drawing Sheets

FIG. 4 ately to ROMs and a manuscript method for
MEMORY HAVING A TRENCH TYPE GATE STRUCTURE This is a division of application Ser. No. 08/839,633, filed Apr. 15, 1997.

BACKGROUND OF THE INVENTION

1. Field of Invention

This invention relates generally to read-only memories (ROMs) and a method for manufacturing the same, and more particularly to ROMs and a manufacturing method for ROMs having a trench-type gate structure buried within a substrate and a source/drain terminal structure formed above the substrate.

2. Description of Related Art

ROMs are widely used in digital equipment such as microcomputers and microprocessor operating systems. ROMs normally store resident programs, such as BIOS used by operating systems. ROM manufacturing processes involve time-consuming steps and material processes. Generally, ROM customers submit program codes to a ROM manufacturer, and the ROM manufacturer encodes the program codes into the ROM during manufacturing.

Despite the different program codes stored during manufacturing, most ROMs have identical physical structures. Therefore, ROM manufacturers complete ROM manufacturing to a state immediately before actual programming, and then store the partially finished ROMs in a warehouse. When customers order ROMs requiring a particular program code, the manufacturer creates a set of photomasks and subsequently programs the partially-finished ROMs in inventory with the program code provided by the customer. This procedure of photomask programming a prefabricated ROM has become the norm in the semiconductor manufacturing industry.

Figure 1A:
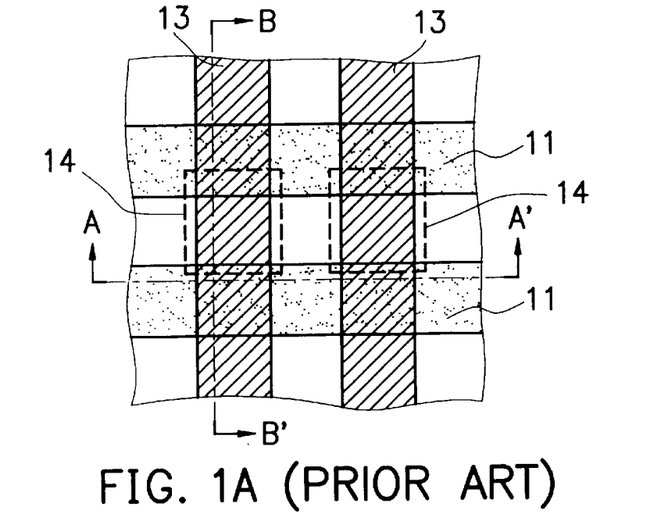
FIG. 1A is a partial top view of a conventional ROM.
Figure 1B:
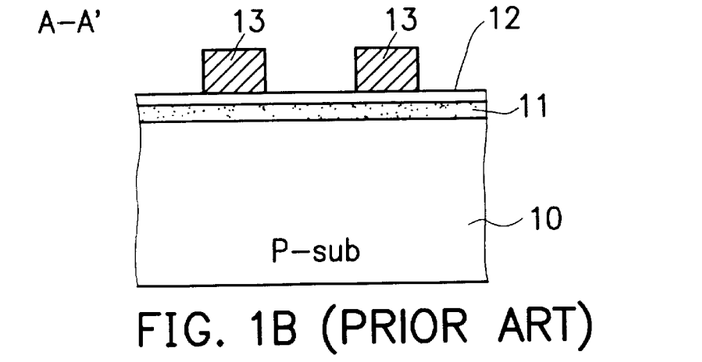
FIG. 1B is a cross-sectional front view of the conventional ROM of FIG. 1A.
Figure 1C:
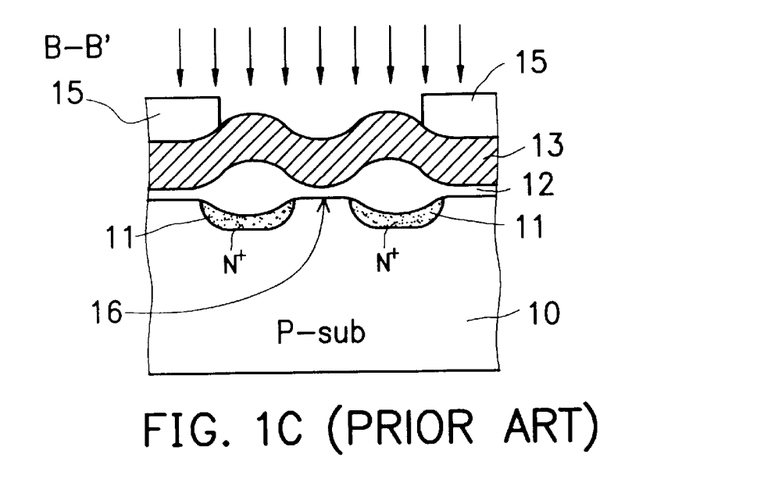
FIG. 1C is a cross-sectional side view of the conventional ROM of FIG. 1A.

Generally, a basic memory cell unit of a ROM comprises a channel transistor. During the programming phase ions are selectively implanted into specified channels of the channel transistor, adjusting the threshold voltage thereof and achieving ON/OFF control of the memory cell unit. FIGS. 1A–1C show the manufacturing steps involved in the creation of a conventional ROM. FIG. 1A is a partial top view, FIG. 1B is a partial front view, and FIG. 1C is a partial cross-sectional side view of the conventional ROM. As shown, the conventional ROM includes a substrate 10, such as, for example, a P-type silicon substrate, having a plurality of bit lines 11, an oxide layer 12 and a plurality of word lines 13 formed on a top surface of substrate 10. Referring to FIG. 1A, areas 14 enclosed by the rectangular dash lines comprise the memory cell units. Whether or not ions are implanted into a channel 16 of the memory cell unit determines if the memory cell unit contains a binary bit of "0" or "1", respectively.

As shown in FIG. 1C, N-type impurities, such as arsenic ions, are implanted into substrate 10 forming the plurality of equidistant bit lines 11, wherein the areas between two bit lines 11 constitute channel regions 16. Next, an oxidation process forms an oxide layer 12 on the surface of bit lines 11 and channel regions 16. A conductive layer, such as for example, a heavily doped polysilicon layer, is subsequently formed, followed by photolithographic and etching processes that form word lines 13 crossing over bit lines 11, and thus form the completed prefabricated conventional ROM.

In the programming phase of manufacturing the conventional ROM, program codes are encoded in the ROM by forming a masking layer 15 on the surface of word lines 13 that exposes channel regions 16 to be encoded. The programming phase is complete upon implantation of P-type impurities, such as, for example, boron ions, in the exposed channel regions 16. Different doping sources may be used during the programming phase so to obtain different properties for the transistors.

Figure 2A:
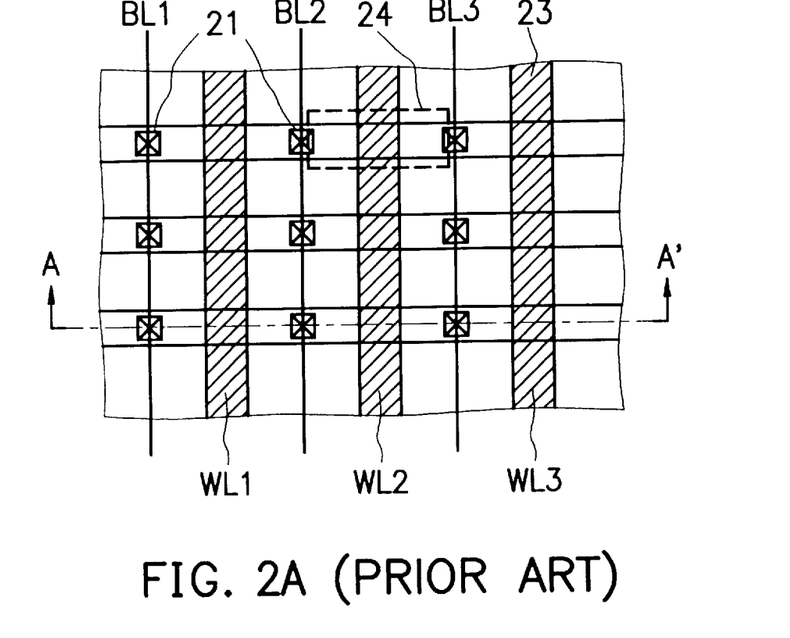
FIG. 2A is a partial top view a another conventional ROM.
Figure 2B:
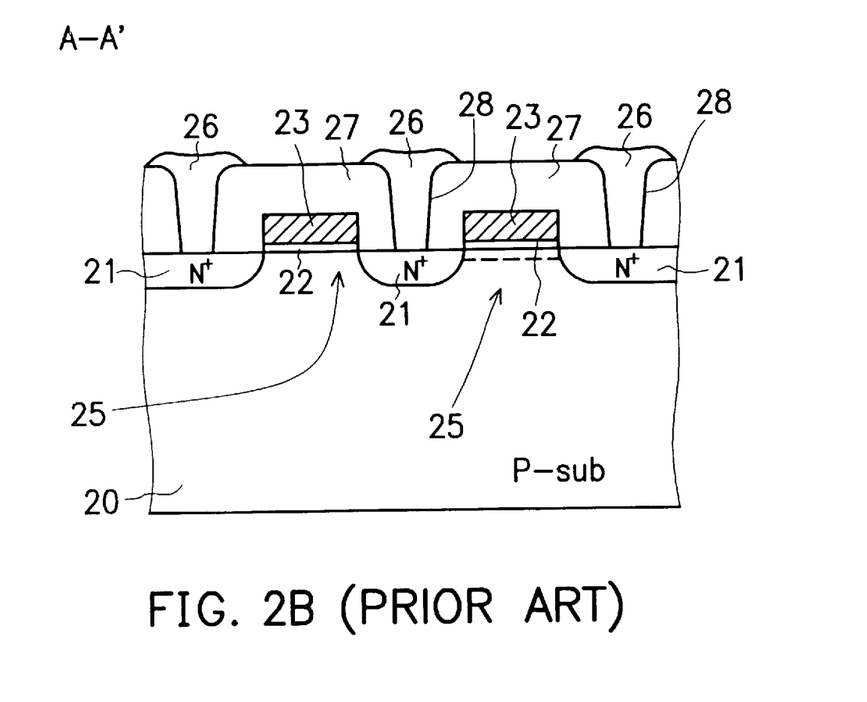
FIG. 2B is a cross-sectional side view of the conventional ROM of FIG. 2A.

FIGS. 2A and 2B show another conventional ROM. FIG. 2A is a partial top view and FIG. 2B is a cross-sectional side view of the second conventional ROM. The area 24 within the rectangular dash lines of FIG. 2A comprises the memory cell unit. The manufacturing method for the conventional ROM shown in FIGS. 2A and 2B comprises the steps of implanting N-type impurities, such as, for example, arsenic ions, into a substrate 20 forming a plurality of equidistant source/drain terminals 21, wherein the area between two source/drain terminals 21 constitutes a channel region 25. A subsequent step comprises encoding program codes in the ROM by exposing channel regions 25 to be encoded to implantation of P-type impurities, such as, for example, boron ions. A further step includes forming an oxide layer 22 and a conductive layer, such as a heavily doped polysilicon layer. Thereafter, the method comprises the step of forming the conductive layer into word lines 23, constituting channel transistors, by using photolithographic and etching processes. A subsequent step includes forming an insulating layer 27 on word lines 23 and providing a plurality of contact window openings 28 in the insulating layer 27, wherein a bottom portion of the plurality of contact window openings 28 is connected to source/drain terminals 21. Finally, the method comprises the step of forming contact windows 26 by filling the plurality of contact window openings 28 with a metal, such as aluminum.

SUMMARY OF THE INVENTION

It is therefore an object of the present invention to provide a ROM and method for manufacturing a ROM that is planar and in which current is prevented from leaking between source/drain regions and a substrate.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, the invention comprises method for manufacturing a read-only memory, comprising the steps of: forming a pad oxide layer over a first conductivity-type substrate; forming a photoresist layer on a surface of the pad oxide layer, defining a pattern on the photoresist layer and forming a plurality of parallel trenches in the substrate along a first direction; performing a first ionic-type doping operation using the photoresist layer as a mask to form a plurality of barrier insulating layers, wherein the photoresist layer is removed thereafter; forming a first insulating layer over surfaces of both the substrate and the plurality of parallel trenches; forming a first conductive layer over a surface of the first insulating layer to fill the plurality of parallel trenches; etching the first conductive layer until heights of the first conductive layer and the substrate surface are substantially the same; removing the first insulating layer and the pad oxide layer exposed on the top surface of the substrate so to expose the top surface of the substrate; forming a second insulating layer over the top surfaces of both the substrate and the first conductive layer; forming a second conductive layer over a top surface of the second insulating layer; annealing the second conductive layer; and implanting ions on a surface of the second conductive layer so to adjust a threshold voltage of the second conductive layer. The method further comprises the steps of: defining a pattern on the second conductive layer and forming a plurality source/drain regions parallel along a first direction and a plurality of channel regions parallel along a second direction and being connected to the source/drain regions, wherein the first direction crosses the second direction at an angle, and a plurality of openings are formed in middle portions of intersections of the plurality of source/drain regions and the plurality of channel regions; forming a third insulating layer that fills the plurality of openings; implanting ions of a second ionic type into the source/drain regions; performing an encoding operation by implanting ions into select ones of the plurality of channel regions; forming a planar fourth insulating layer above the top surfaces of the first conductive layer ad the third insulating layer; patterning the fourth insulating layer to forming a plurality of gate region contact windows exposing the first conductive layer and a plurality of source/drain region contact windows exposing the plurality of source/drain regions; and forming a third conductive layer in the plurality of gate region contact windows and the plurality of source/drain region contact windows so to form a plurality of gate region electrodes and a plurality of source/drain region electrodes, respectively.

In accordance with another aspect, the present invention comprises a read-only memory comprising: a substrate having a plurality of parallel trenches extending in a first direction; a plurality of barrier insulating layers within the substrate and surrounding the plurality of parallel trenches; a first insulating layer formed on a surface of the plurality of parallel trenches; a plurality of gate regions formed in the plurality of parallel trenches, wherein the plurality of gate regions represent word lines; a second insulating layer formed on the surfaces of the substrate and the plurality of gate regions; a first conductive layer arranged in a checkerboard fashion above the second insulating layer, the first conductive layer comprising of a plurality of source/drain regions running parallel along a first direction and a plurality of channel regions located above the plurality of gate regions, running parallel along a second direction and being connected to the plurality of source/drain regions, wherein the plurality of source/drain regions act as bit lines, the threshold voltages of the plurality of channel regions are adjustable, the first direction crosses the second direction at an angle, and a plurality of openings expose a portion of the second insulating layer are formed in middle portions intersections of the plurality of source/drain regions and the plurality of channel regions; a third insulating layer filling the plurality of openings; a fourth insulating layer above the surfaces of both the first conductive layer and the third insulating layer; a plurality of gate region contact windows formed in the fourth insulating layer to expose a portion of the plurality of gate regions; a plurality of source/drain region contact windows formed in the fourth insulating layer to expose a portion of the plurality of source/drain regions; a plurality of gate region electrodes formed in the plurality of gate region contact windows and on the surface of the fourth insulating layer so to surround the plurality of gate region contact windows; and a plurality of source/drain region electrodes formed in the plurality of source/drain region contact windows and on the surface of the fourth insulating layer so to surround the plurality of source/drain region contact windows.

It is to be understood that the foregoing general description and the following detailed description are exemplary and explanatory only and are not restrictive of the invention as claimed.

BRIEF DESCRIPTION OF THE DRAWINGS

The accompanying drawings are included to provide a further understanding of the invention and are incorporated in and constitute part of the specification, illustrate preferred embodiments of the invention, and, together with a description, serve to explain the principles of the invention.

DESCRIPTION OF THE PREFERRED EMBODIMENT

Reference will be made in detail to the present preferred embodiment of the invention, an example of which is illustrated in the accompanying drawings. Like reference numerals refer to like parts in the various figures of the drawings.

Figure 3A:
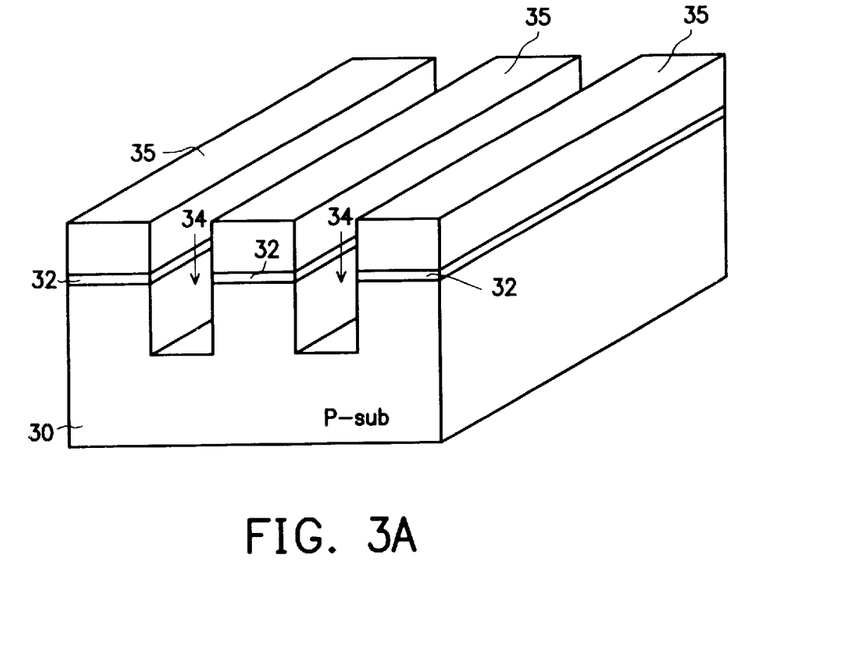
FIGS. 3A–3M show a method for manufacturing a ROM in accordance with a preferred embodiment of the present invention.

Referring to FIG. 3A, a planar silicon substrate or another electrically-insulating material is provided as a base for the ROM of the preferred embodiment. In this embodiment, a P-type silicon substrate is used, and a thermal oxide method, for example, forms a pad oxide layer 32 of silicon dioxide on substrate 30. A photoresist layer 35 is then coated on pad oxide layer 32, and a photolithography method defines gate regions are photolithographically defined in photoresist layer 35. Subsequently, a dry etching process, such as, for example, a reactive ion etching process, etches substrate 30, oxide layer 32 and photoresist layer 35 to form a plurality of substantially parallel trenches 34.

Figure 3B:
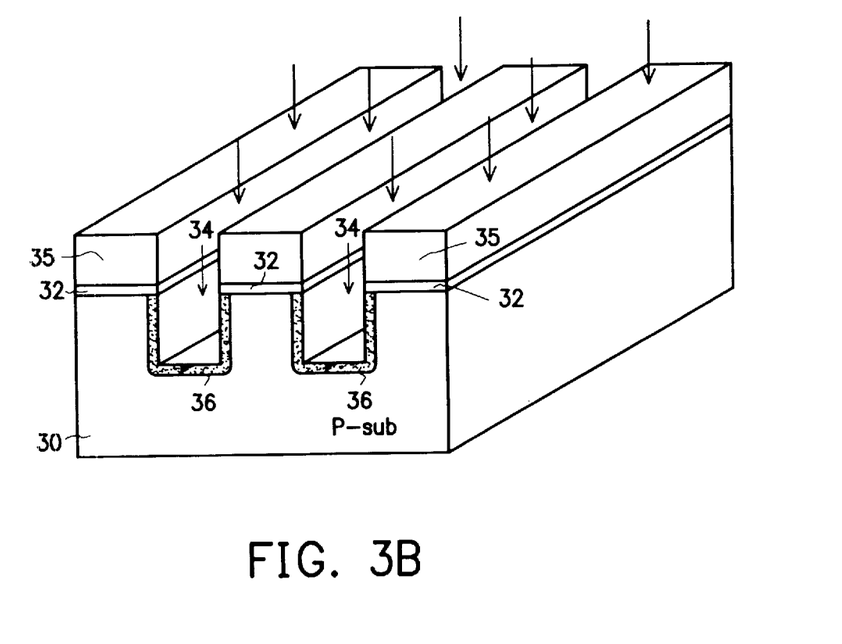

As shown in FIG. 3B, ions, such as, for example, P-type ions, are implanted, using photoresist layer 35 as mask, to form a plurality of barrier layers 36 on the sides and the bottom of the trenches 34. The photoresist layer 35 is subsequently removed.

Figure 3C:
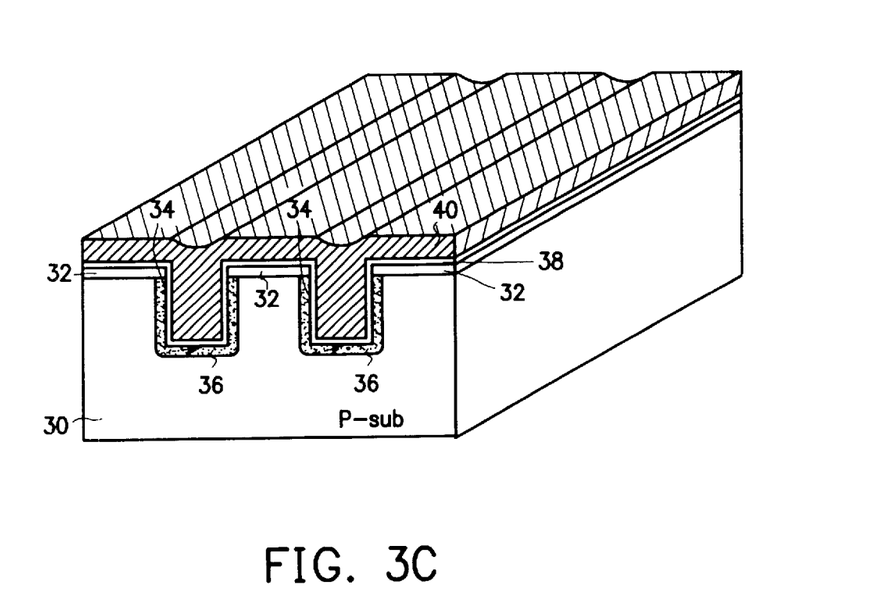

Referring to FIG. 3C, a thermal oxide method or a chemical vapor deposition (CVD) method, for example, forms an insulating layer 38 over the surface of substrate 30 and in trenches 34. Insulating layer 38 may be, for example, a silicon oxide or silicon nitride layer. A conductive layer 40 is then formed over the surface of insulating layer 38, filling trenches 34. The conductive layer 40 may be, for example, a heavily doped polysilicon layer, formed by a CVD method.

Figure 3D:
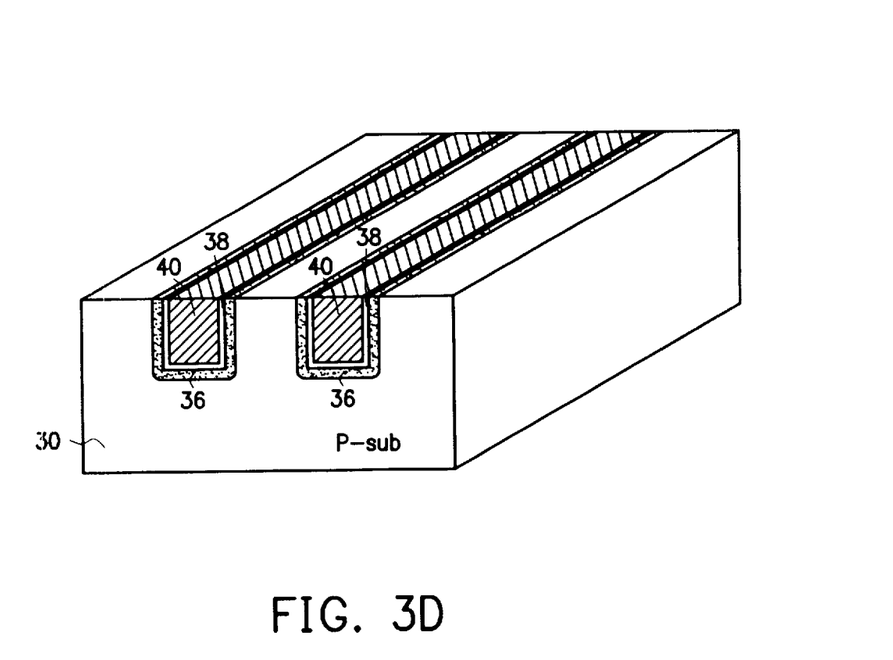

As shown in FIG. 3D, a subsequent step of the method of the present invention comprises removing conductive layer 40 with an anisotropic etching process or a chemical-mechanical polishing method until the surfaces of conductive layer 40 and substrate 30 are substantially the same height. Thereafter, an exposed portion of insulating layer 38 and pad oxide layer 32 are removed to expose the top surface of substrate 30, wherein conductive layer 40 remains in trenches 34 and constitutes gate regions having a bottom portion separated from substrate 30 by insulating layer 38.

Figure 3E:
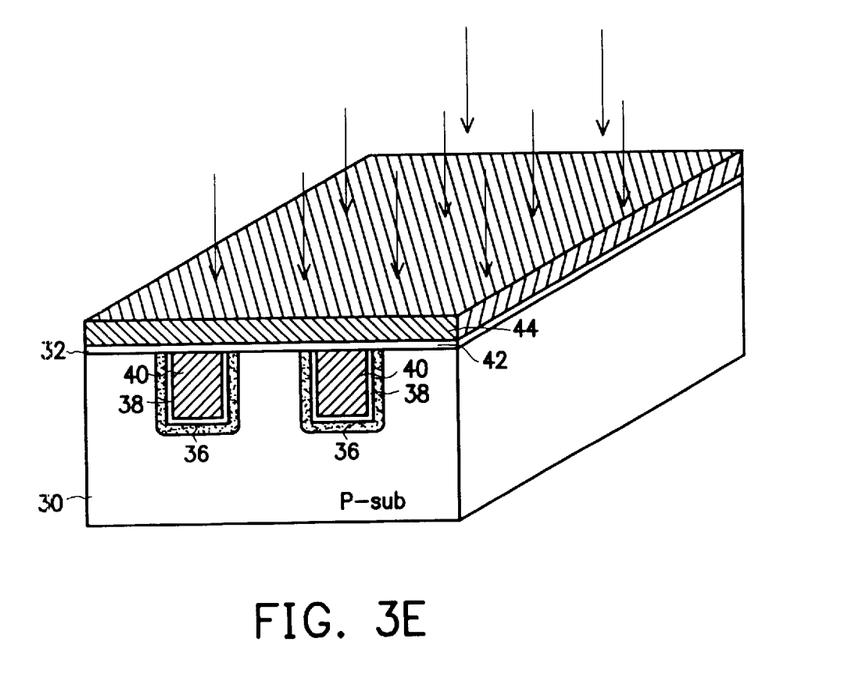

Referring to FIG. 3E, a CVD method forms an insulating layer 42 comprising, for example, a silicon dioxide layer or a silicon nitride layer, over exposed surfaces of substrate 30 and conductive layer 40, wherein insulating layer 42 acts as a gate oxide layer. A conductive layer 44 is then formed over a top surface of insulating layer 42, and is annealed using, for example, a rapid thermal annealing (RTA) process so to activate grain regrowth of crystal grains inside conductive layer 44. Conductive layer 44 may be, for example, a polysilicon oxide or monocrystlline silicon layer. Next, ions, such as, for example, N-type or P-type ions, are implanted into conductive layer 44 to adjust a threshold voltage of conductive layer.

Figure 3F:
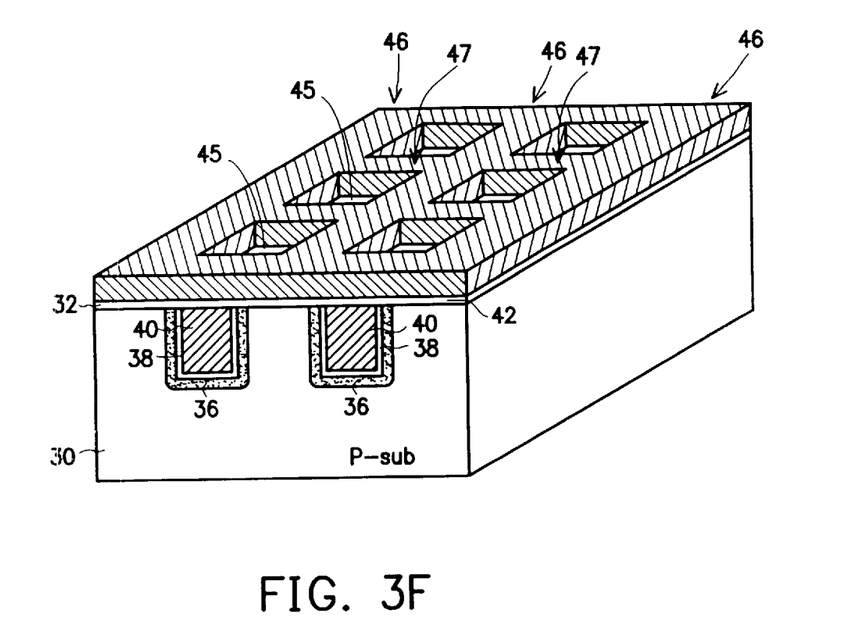

As shown in FIG. 3F, photolithographic and etching processes define and etch, respectively, a pattern in conductive layer 44, exposing insulating layer 42 and forming a plurality of parallel source/drain regions 46 and a plurality of parallel channel regions 47 connected to the plurality of source/drain regions 46. The source/drain regions 46 and the channel regions 47 cross each other at an angle of, preferably, ninety degrees, and a plurality of openings 45 are provided in middle portions of intersections of the plurality of source/drain regions 46 and the plurality of channel regions 47. Thus, the plurality of source/drain regions 46 and the plurality of trenches 34 form a checkerboard pattern.

Figure 3G:
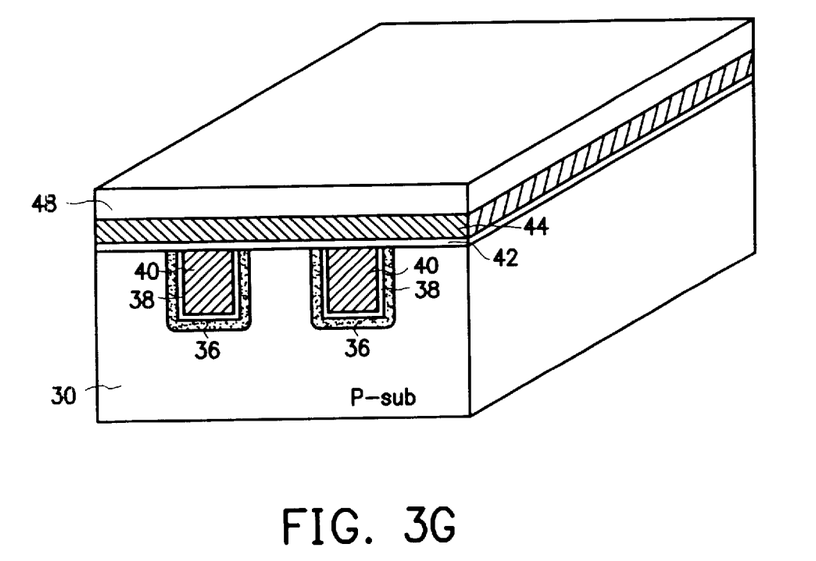
Figure 3H:
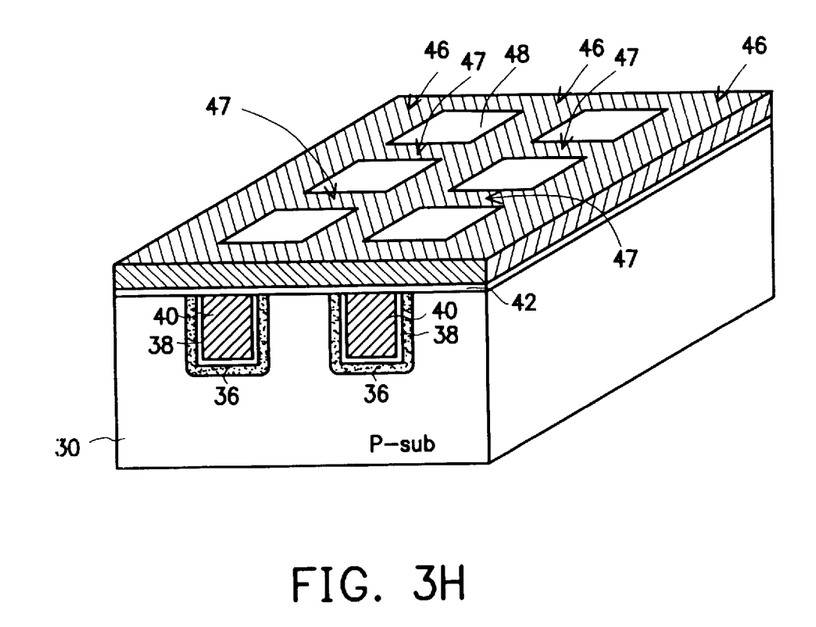

Referring to FIGS. 3G and 3H, an insulating layer 48 is formed above conductive pattern and in the plurality of openings 45. Insulating layer 48 preferably comprises, for example, a silicon dioxide layer or a silicon nitride layer formed by a CVD method or a spin-on glass method. Thereafter, an anisotropic etch-back method or a chemical-mechanical polishing method, for example, flattens or planarizes insulating layer 48 using the plurality of source/drain regions 46 and the plurality of channel regions 47 as an etch or polishing end point, wherein a residual portion of insulating layer 48 remains in openings 45.

Figure 3I:
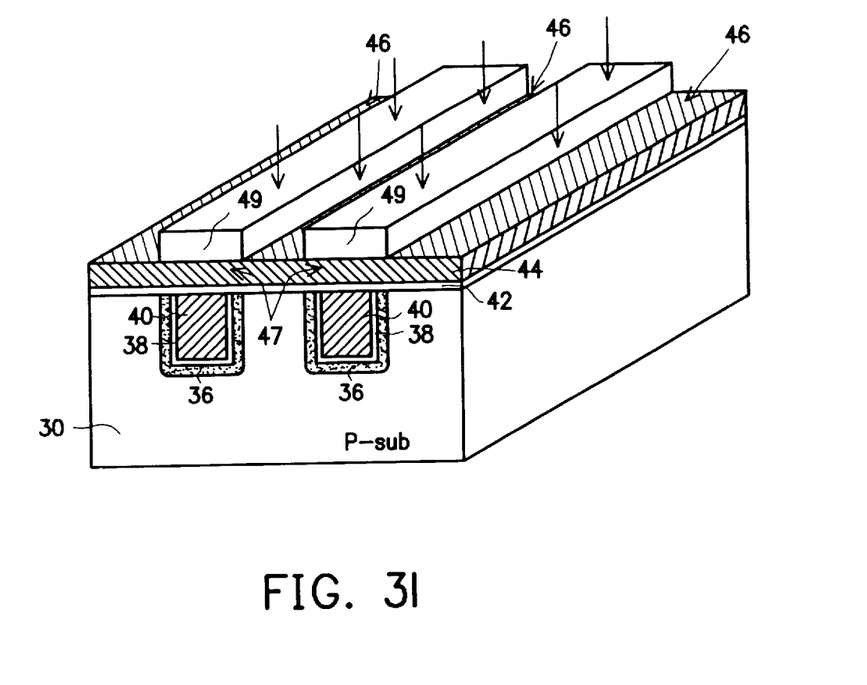
Figure 3J:
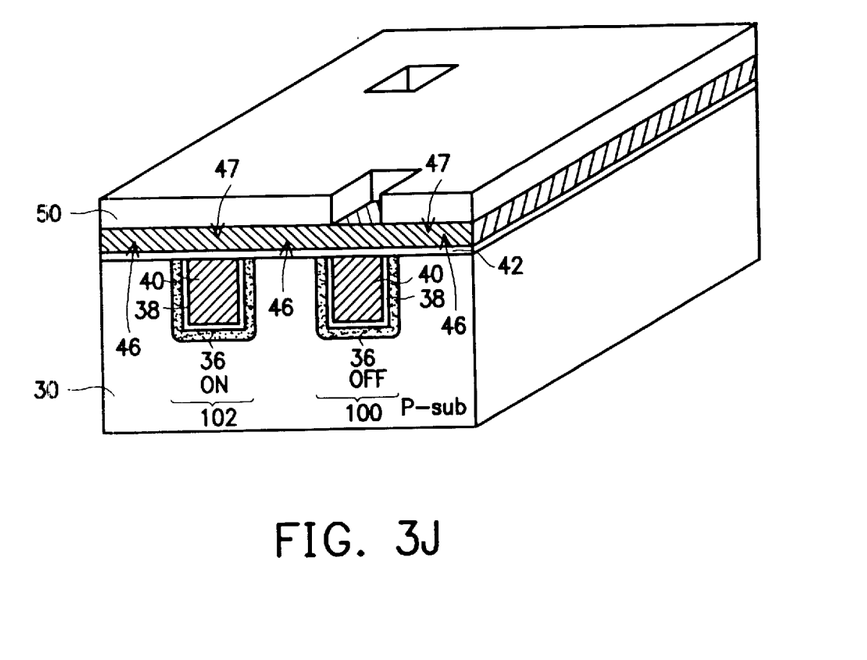

A photoresist layer 49, as shown in FIG. 3I, is coated above insulating layer 48 and conductive layer 44, and then a photolithographic technique patterns photoresist layer 49 such that the plurality of source/drain regions 46 are exposed. Next, using photoresist layer 49 as a mask, the plurality of source/drain regions 46 are doped with highly concentrated ions, preferably N-type ions, lowering resistances of the plurality of source/drain regions 46 so to obtain a plurality of N$^+$source/drain regions 46. The photoresist layer 49 is subsequently removed, completing the prefabrication portion of the manufacturing method of the present invention Referring to FIG. 3J, the program encoding portion of the method comprises the steps of forming a photoresist layer 50 on conductive layer 44, and defining photoresist layer 50 with a photolithographic process, exposing designated OFF channel regions 47. With photoresist layer 50 acting as a mask, exposed designated OFF channel regions 47 are ion implanted using, for example, P-type ions. Photoresist layer 50 is subsequently removed, completing the program encoding portion of the method. Memory units having channel regions implanted with ions become OFF state memory units, such as memory unit 100, while memory units in which ion implantation is prevented due to the masking photoresist layer become ON state memory units, such as memory unit 102.

Figure 3K:
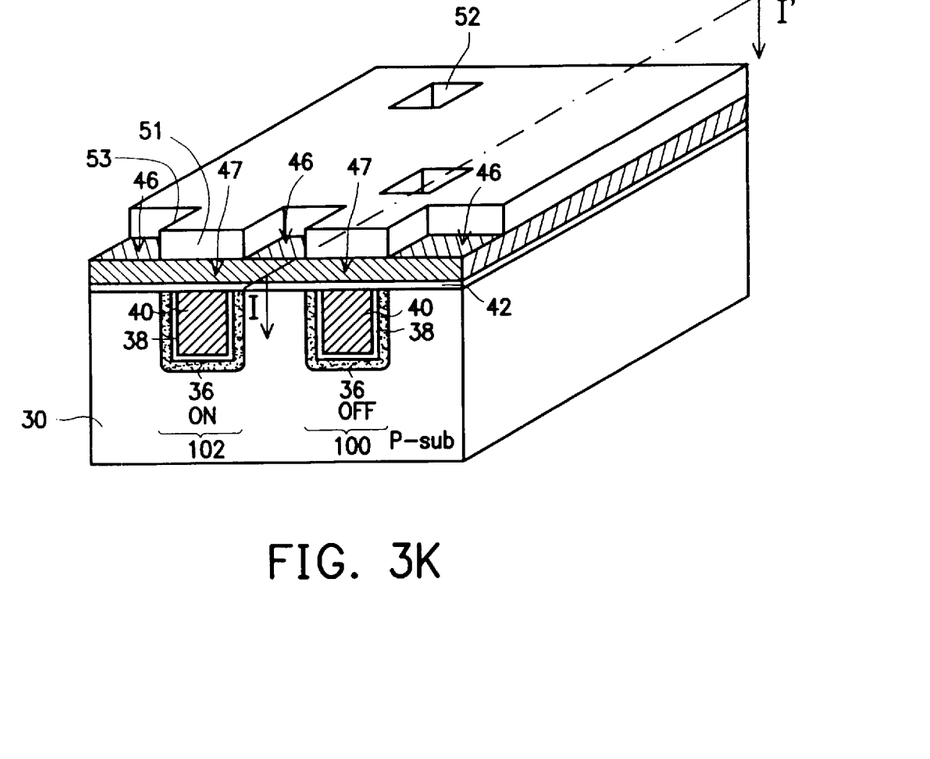

As shown in FIG. 3K, subsequently source/drain and gate region contact windows are formed by coating an insulating layer 51 over a top surface of the device. Insulating layer 51 preferably comprises, for example, a planar insulating layer such as a silicon oxide layer, a silicon nitride layer, or a boro-phosilicate glass layer. A pattern is then defined in the insulating layer 51, followed by removal of exposed portions of insulating layer 48, thereby forming a plurality of gate region contact window openings 52 exposing gate regions 40 and a plurality of source/drain region contact window openings 53 exposing source/drain regions 46.

Figure 3L:
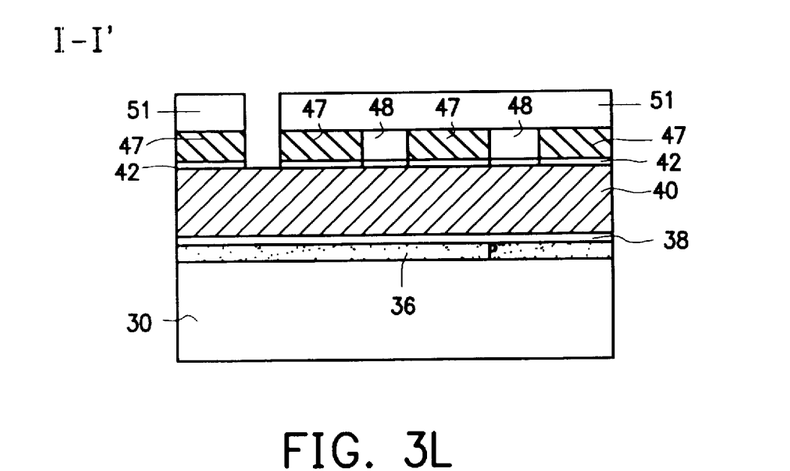
Figure 3M:
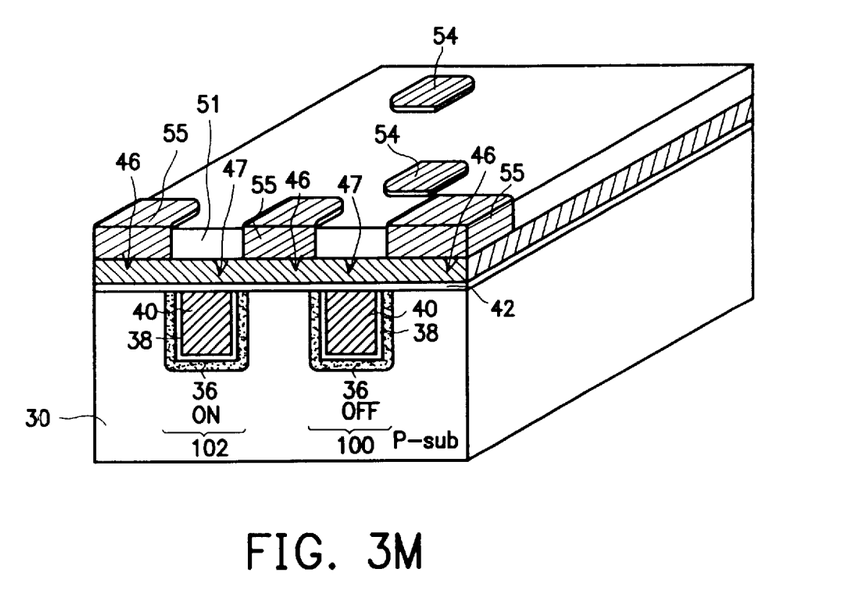

FIG. 3L is a cross-sectional view taken along line I–I' of FIG. 3K. As shown in FIG. 3L, a metal, such as aluminum, is provided in the plurality of gate region contact window openings 52 and the plurality of source/drain region contact window 53 to form gate electrodes 54 and source/drain electrodes 55, respectively. The final configuration of the ROM in accordance with the preferred embodiment of the present invention is shown in FIG. 3M. Since subsequent ROM manufacturing processes indirectly relate to the present invention, a detailed description of these processes have been omitted.

A P-type substrate was used in the preferred embodiment of the present invention, described above. However, the present invention may be equally applied to an N-type substrate. When an N-type substrate is used, all the aforementioned processes using N-type ions have to be replaced with P-type ions, while those processes using P-type ions have to be replaced with N-type ions.

Figure 4:
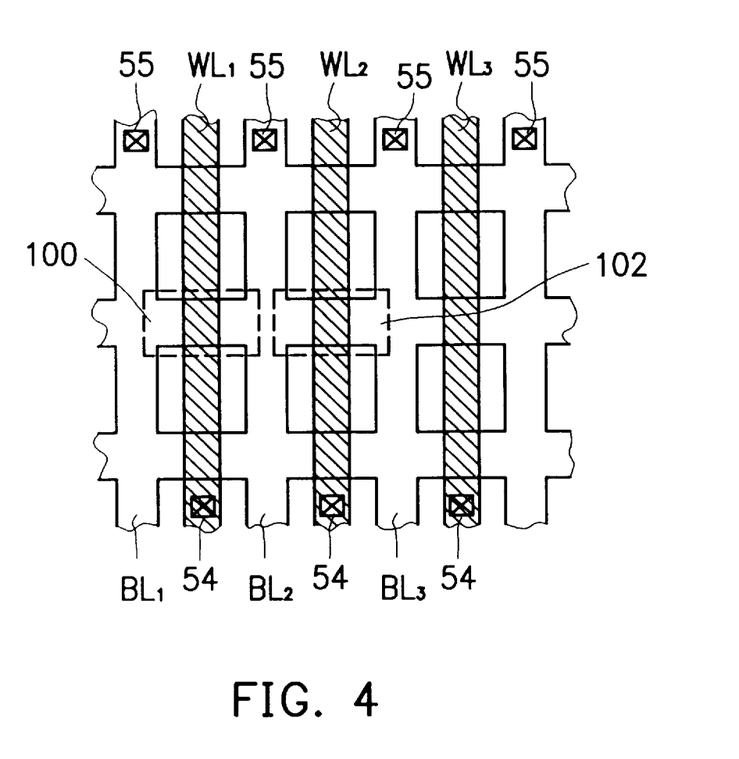
FIG. 4 is a partial top view of the ROM fabricated according to the preferred embodiment of the present invention.

A partial top view of the ROM fabricated according to the preferred embodiment of the present invention is shown in FIG. 4. In the FIG. 4, the portion within the dashed lines labeled 100 is an OFF state memory unit while the portion within the dashed lines labeled 102 is an ON state memory unit.

The preferred embodiment of the ROM of the present invention comprises several advantages. Specifically, by employing the trench-type gate region in the substrate and by isolating the gate region from the substrate and the source/drain regions with the insulating layer, the ROM of the present invention prevents currents from leaking between the substrate and the source/drain regions. Further, by performing program encoding implantation separately after channel transistor formation, enables a manufacturer to store ROMs having completed channel transistors, thus shortening the production time from customer order to delivery. Finally, the manufacturing method of ROM in accordance with the present invention may be used for manufacturing a ROM having a silicon on insulator (SOI) structure.

It will be apparent to those skilled in the art that various modifications and variations can be made to the ROM of the present invention without departing from the scope or spirit of the invention. Thus, it is intended that the present invention cover the modifications and variations of this invention provided they come within the scope of the appended claims and their equivalents.

What is claimed is:

1. A read only memory comprising:
   a substrate having a plurality of parallel trenches extending in a first direction;
   a plurality of barrier insulating layers within the substrate and surrounding the plurality of parallel trenches;
   a first insulating layer formed on a surface of the plurality of parallel trenches;
   a plurality of gate regions formed in the plurality of parallel trenches, wherein the plurality of gate regions represent word lines;

a second insulating layer formed on the surfaces of the substrate and the plurality of gate regions;

a first conductive layer arranged in a checkerboard fashion above the second insulating layer, the first conductive layer comprising of a plurality of source/drain regions running parallel along a first direction and a plurality of channel regions located above the plurality of gate regions, running parallel along a second direction and being connected to the plurality of source/drain regions, wherein the plurality of source/drain regions act as bit lines, the threshold voltages of the plurality of channel regions are adjustable, the first direction crosses the second direction at an angle, and a plurality of openings exposing a portion of the second insulating layer are formed in middle portion intersections of the plurality of source/drain regions and the plurality of channel regions;

a third insulating layer filling the plurality of openings;

a fourth insulating layer above the surfaces of both the first conductive layer and the third insulating layer;

a plurality of gate region contact windows formed in the fourth insulating layer to expose a portion of the plurality of gate regions;

a plurality of source/drain region contact windows formed in the fourth insulating layer to expose a portion of the plurality of source/drain regions;

a plurality of gate region electrodes formed in the plurality of gate region contact windows and on the surface of the fourth insulating layer so to fill the plurality of gate region contact windows; and a plurality of source/drain region electrodes formed in the plurality of source/drain region contact windows and on the surface of the fourth insulating layer so to fill the plurality of source/drain region contact windows.

2. A read-only memory according to claim 1, wherein the first insulating layer is a silicon oxide layer.

3. A read-only memory according to claim 1, wherein the first insulating layer is a silicon nitride layer.

4. A read-only memory according to claim 1, wherein the plurality of gate regions are polysilicon layers having high impurity concentrations.

5. A read-only memory according to claim 1, wherein the second insulating layer is a silicon oxide layer.

6. A read-only memory according to claim 1, wherein the second insulating layer is a silicon nitride layer.

7. A read-only memory according to claim 1, wherein the plurality of source/drain regions are polysilicon layers having high impurity concentrations.

8. A read-only memory according to claim 1, wherein the plurality of source/drain regions are monocrystalline silicon layers having high impurity concentrations.

9. A read-only memory according to claim 1, wherein the first direction is perpendicular to the second direction.

10. A read-only memory according to claim 1, wherein the third insulating layer is a silicon oxide layer.

11. A read-only memory according to claim 1, wherein the third insulating layer is a silicon nitride layer.

12. A read-only memory according to claim 1, wherein the fourth insulating layer is a boro-phosilicate glass layer.

13. A read-only memory according to claim 1, wherein the plurality of gate region electrodes comprise metal.

14. A read-only memory according to claim 1, wherein the plurality of source/drain region electrodes comprise metal.

* * * * *